United States Patent [19]

Seshita

[11] Patent Number: 5,777,517

[45] Date of Patent: Jul. 7, 1998

[54] SEMICONDUCTOR FEEDBACK AMPLIFIER HAVING IMPROVED FREQUENCY CHARACTERISTICS

[75] Inventor: Toshiki Seshita, Kawasaki, Japan

[73] Assignee: Kabushiki Kaisha Toshiba, Kawasaki, Japan

[21] Appl. No.: 715,368

[22] Filed: Sep. 12, 1996

[30] Foreign Application Priority Data

Sep. 13, 1995 [JP] Japan .................. 7-235790

[51] Int. Cl.⁶ .................................................. H03F 1/34
[52] U.S. Cl. ............................ 330/277; 330/85; 330/293; 330/308
[58] Field of Search ........................... 330/59, 85, 277, 330/293, 308; 250/214 A; 359/189

[56] References Cited

FOREIGN PATENT DOCUMENTS 62-76304  4/1987  Japan ............................ 330/59

OTHER PUBLICATIONS

Y. Imai et al., "Design and Performance of Wideband GaAs MMIC's for High-Speed Optical Communication Systems", IEEE Transactions on Microwave Theory and Techniques, vol. 40, No. 2, Feb. (1992), pp. 185–190.

Primary Examiner—James B. Mullins
Attorney, Agent, or Firm—Foley & Lardner

[57] ABSTRACT

The semiconductor amplifier circuit provided with frequency characteristics excellent in both band width and flatness is disclosed. The amplifier circuit comprises: an input section (10) including: a first inversion amplifier circuit (11) for inversion-amplifying an input signal; and a feedback circuit (15) of a field effect transistor having a grounded gate, a source for receiving a feedback signal, and a drain connected to an output terminal of the first inversion amplifier circuit; a first level shift circuit (20) for shifting level of an output of the input section; a second inversion amplifier circuit (30) for inversion-amplifying an output of the first level shift circuit; and a second level shift circuit (40) for shifting level of an output of the second inversion amplifier circuit. Here, the amplifier circuit is characterized in that the output of the second level shift circuit (40) is applied to the feedback circuit (15) as the feedback signal.

20 Claims, 16 Drawing Sheets

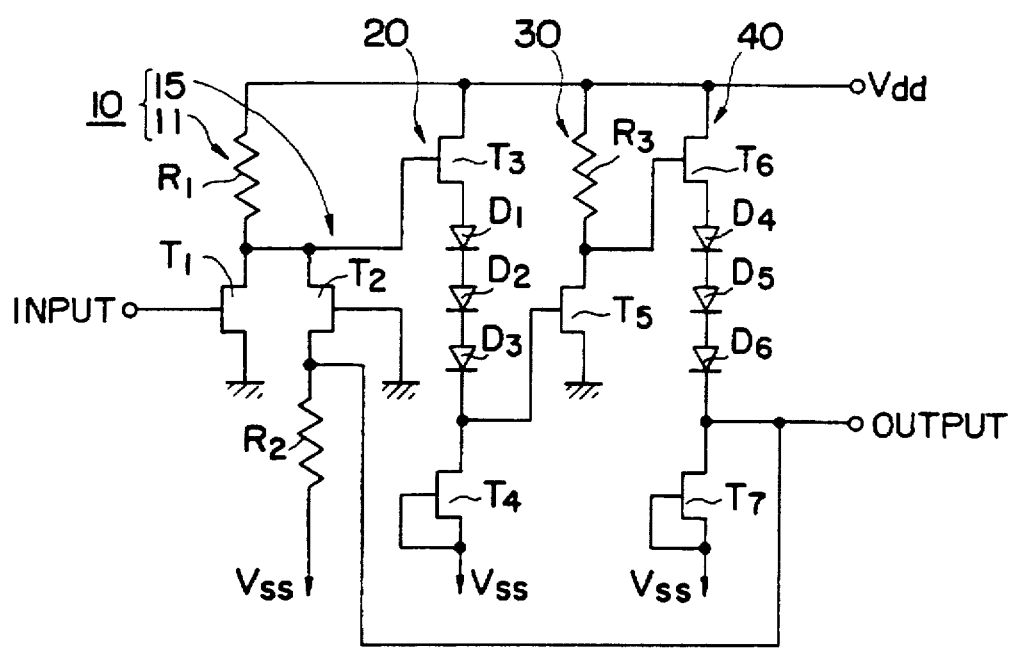
F I G. 1

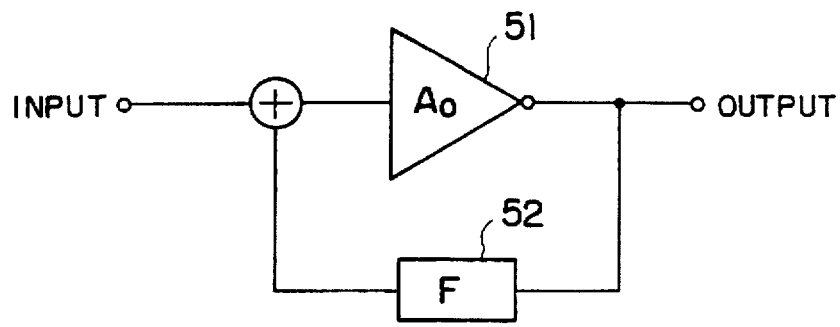
F I G. 5
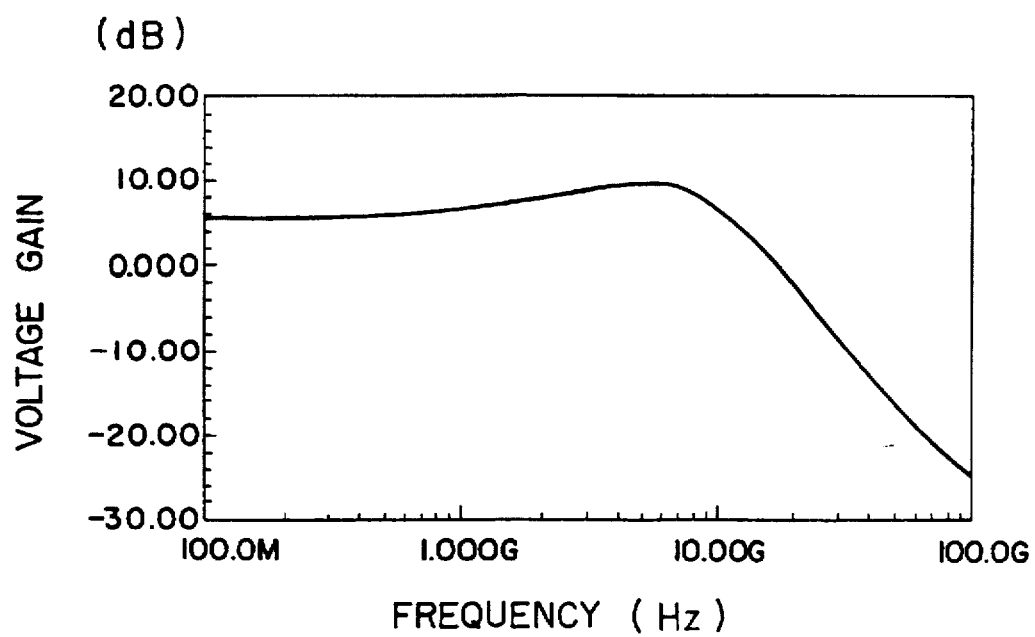
F I G. 6

FET

RESISTANCE

DIODE

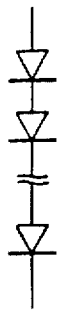     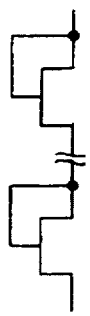     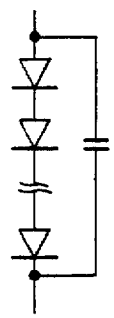     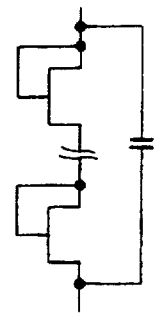
FIG. IIA     FIG. IIB     FIG. IIC     FIG. IID
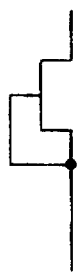          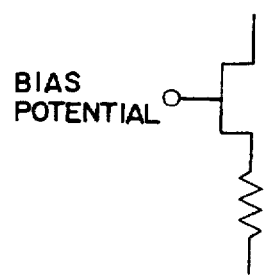
FIG. 12A          FIG. 12B

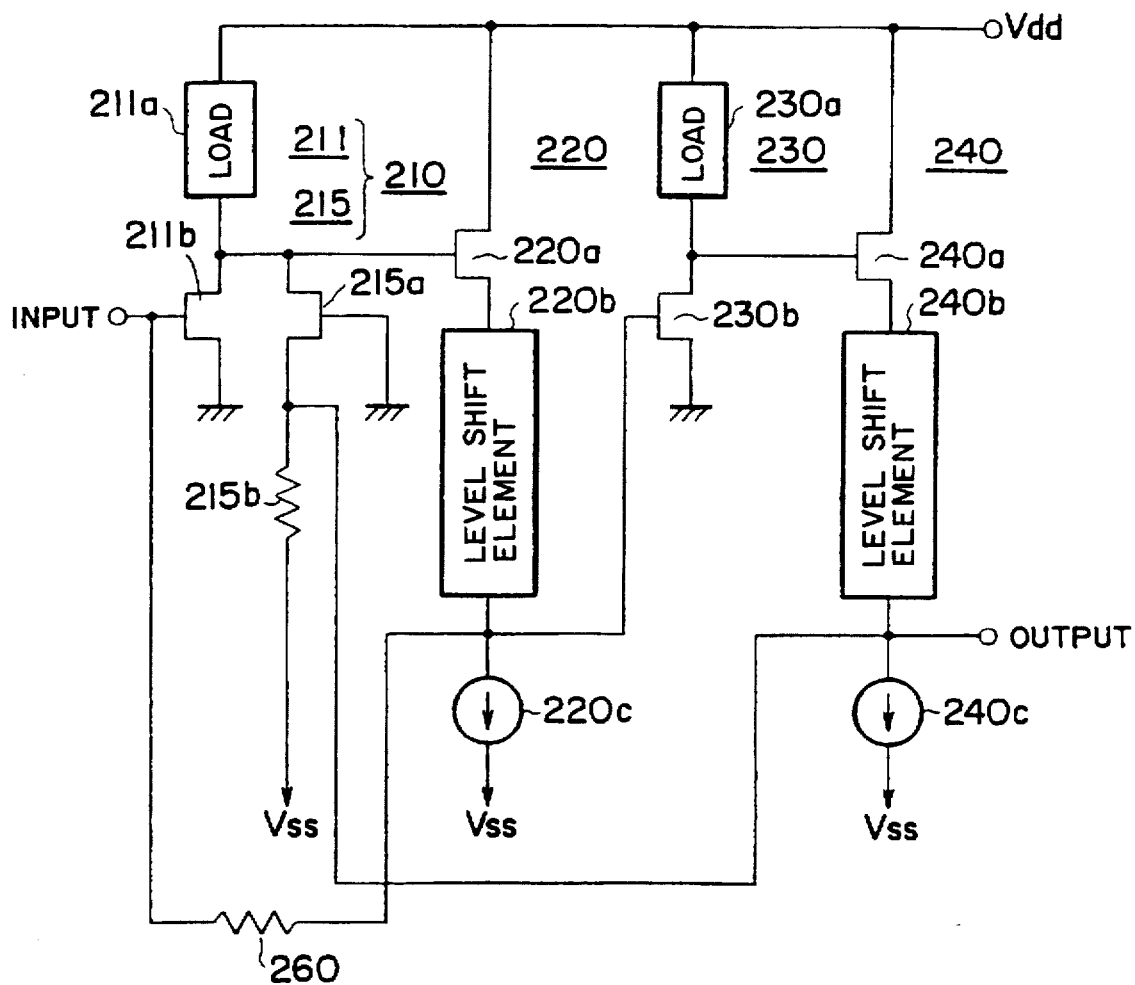
F I G. 14

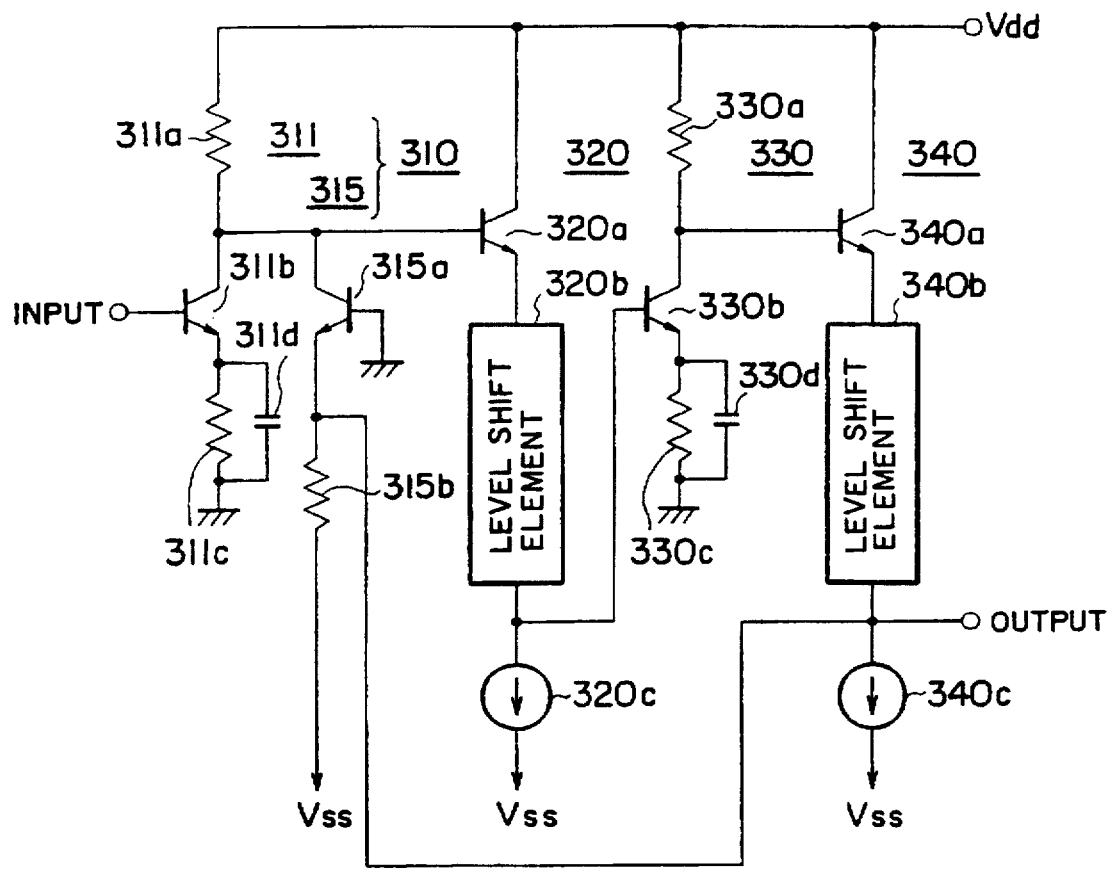
F I G. 16

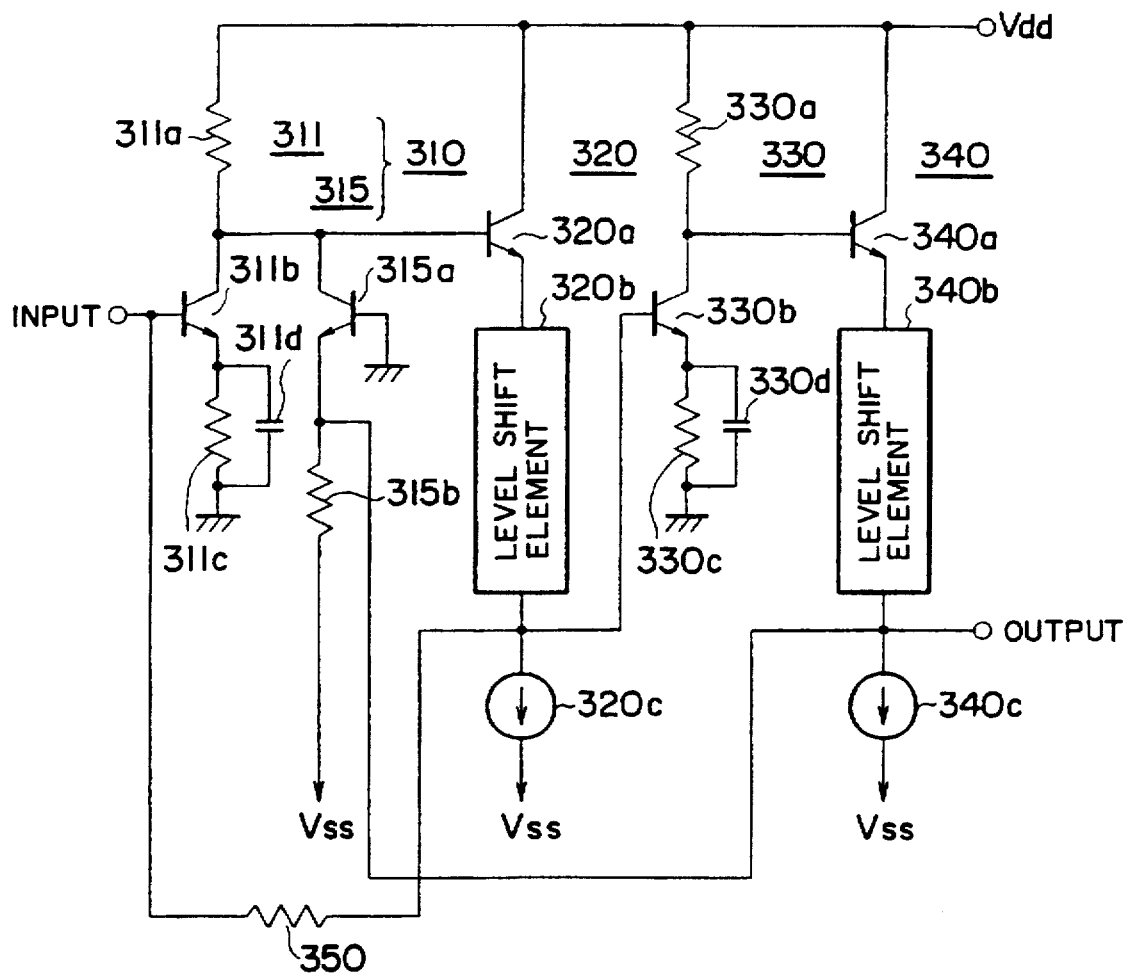
F I G. 17

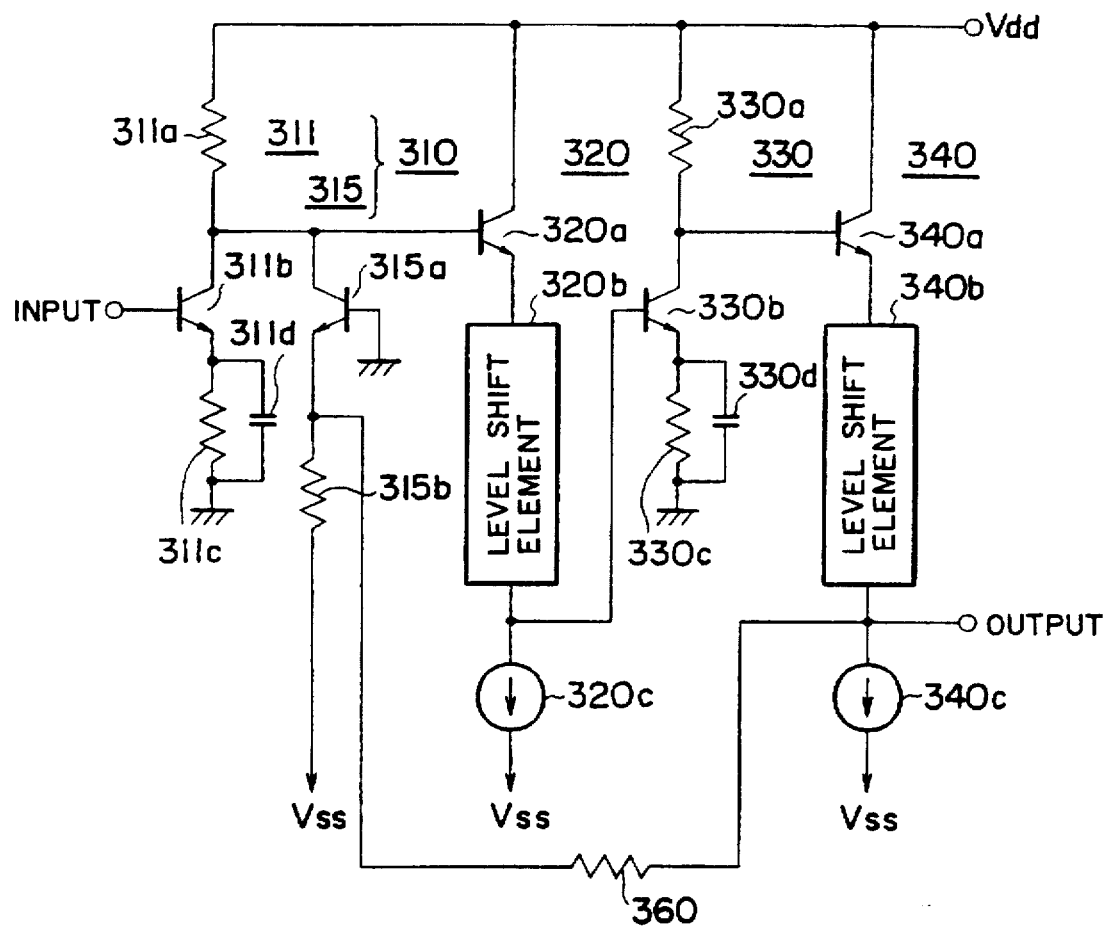
F I G. 18

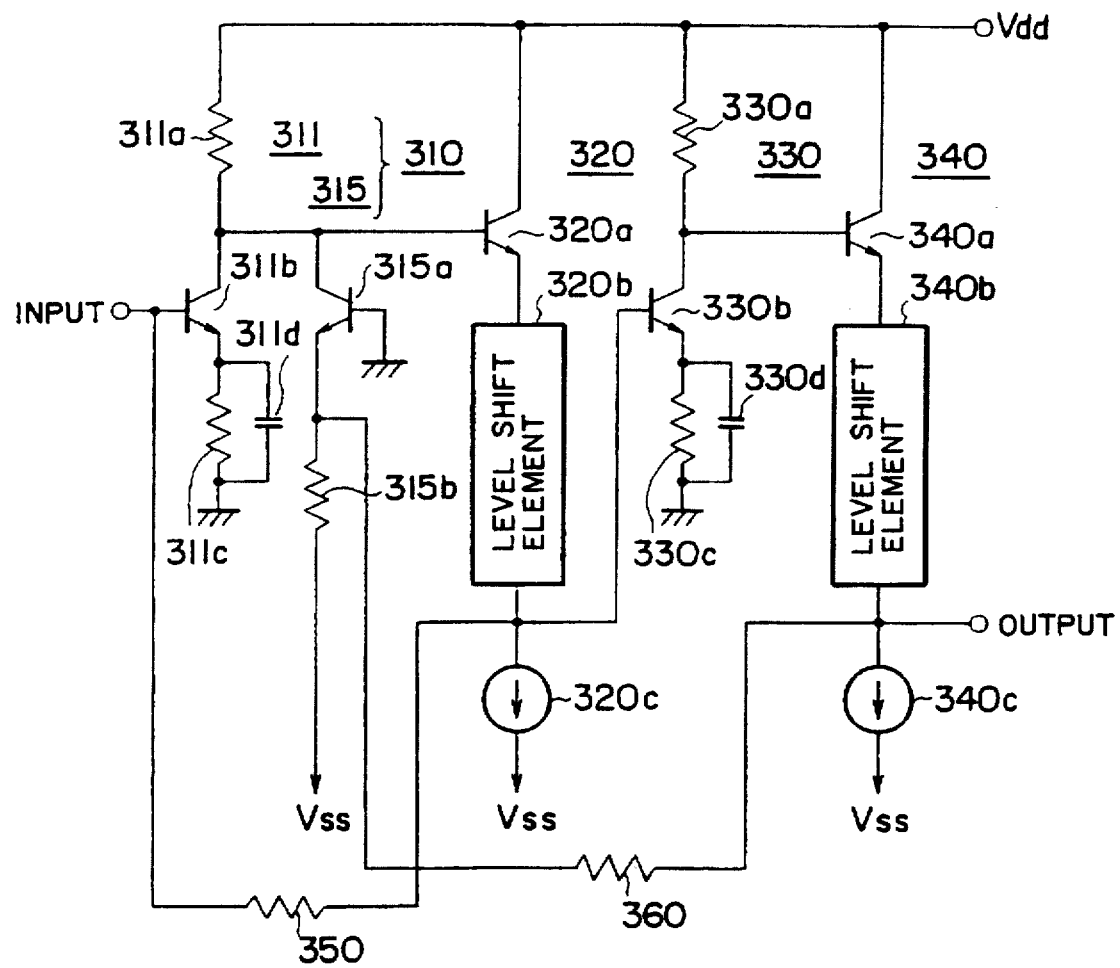
F I G. 19

SEMICONDUCTOR FEEDBACK AMPLIFIER HAVING IMPROVED FREQUENCY CHARACTERISTICS

BACKGROUND OF THE INVENTION

1. Field of the Invention

The present invention relates to a semiconductor amplifying circuit, and more specifically to a semiconductor amplifying circuit which can improve the band width and the flatness in frequency characteristics.

2. Description of the Prior Art

Recently, ICs usable for an ultra high speed communications system (e.g., optical communications system) have been developed energetically. As one of the composing elements of the ultra high speed IC, a wide band amplifier circuit is fundamental and indispensable. In the amplifier circuit used for the optical communications system, the amplifier circuit is mainly used to amplify data signals obtained by converting optical signals into weak electric signals. In this case, as large a gain as more than 40 dB is required as the total gain. In addition, wide band characteristics from dc (on the low frequency side) to a half or more of a data rate clock frequency (on the high frequency side) are required as the gain frequency characteristics. This is because random data patterns must be amplified. For instance, in order to amplify signals at data rate of 10 Gb/s, about 7 GHz or higher band is required. Further, the frequency characteristics of the gain must be as flat as possible in the required band. Here, the band implies a frequency region in which the gain attenuates by 3 dB. In the following description, an angular frequency range in which the gain attenuates by 3 dB is referred to as "band".

Now, in order to realize an amplifier circuit of as wide a band as described above, although semiconductor elements excellent in high speed operation, for instance such as GaAs, MESFET, Si bipolar transistor, hetero bipolar transistor, etc. are used, a circuit technique of widening the band is additionally needed.

As one of the band widening technique, negative feedback is adopted. FIG. 5 shows a concept of the negative feedback amplifier circuit, in which an input signal is amplified by returning a part of an output signal (opposite in phase to the input signal) to the input side thereof. In FIG. 5, $A_o$ denotes an gain of an amplifier circuit 51 obtained when no feedback is applied, and F denotes a feedback ratio. Here, in more strictly, although the open loop gain must be denoted by $-A_o$, $A_o$ is referred to as an open loop gain, hereinafter. In this case, a gain $A_v$ (closed loop gain) of the negative feedback circuit can be expressed by the following formula:

$$A_v = -\frac{A_o}{1 + FA_o} \quad (1)$$

Successively, the frequency characteristics of the negative feedback circuit will be explained hereinbelow by use of a simplified model, to explain the problem involved in the prior art amplifier circuit.

The frequency characteristics of the negative feedback circuit differ according to the open loop gain $A_o$. Here, the open loop gain $A_o$ is assumed to be a total open loop gain obtained by connecting N-stages of unit amplifier circuits each having the open loop gain $A_{o1}$. Here, the gain $A_{o1}$ is assumed to have a unit pole. To the amplifier circuit having a unit pole, a common source circuit composed of an FET and a load resistance approximately corresponds. In this case, the open loop gains $A_{o1}$ and $A_{o1}$ can be expressed, respectively as follows:

$$A_o = A_{o1}^N \quad (2a)$$

$$A_{o1} = \frac{G_o}{1 + s/\omega_o} \quad (2b)$$

where $s=j\omega$; $j=(-1)^{1/2}$ and $\omega$ denotes the angular frequency. Further, $G_o$ denotes the DC gain of the unit amplifier circuit having a gain $A_{o1}$; and $\omega_o$ denotes an angular frequency at which the gain attenuates by 3 dB, that is, the amplitude level decreases down to $1/(2)^{1/2}$.

In the following description, a product of $G_o$ and $\omega_o$ is assumed to be kept constant. This assumption corresponds to such a well-known theory that if the unit amplifier circuit is a common source circuit, for instance and further the same FET is used, "the product of $G_o$ and $\omega_o$ can be kept constant, even if the load resistance changes".

Now, the closed loop gain can be obtained by substituting the formulae (2a) and (2b) for the formula (1) as follows:

$$A_v = -\frac{G_o^N}{(1 + s/\omega_o)^N + FG_o^N} \quad (3)$$

Therefore, when N=1, $A_v$ can be obtained by the following formula:

$$A_v = -\frac{1}{FG_o + 1} \cdot \frac{G_o}{1 + s/[\omega_o(FG_o + 1)]} \quad (4)$$

Here, when the feedback ratio F is a constant which is independent of frequency, since DC gain can be expressed as $G_o/(FG_o+1)$ and the angular frequency $\omega_c$ at which the gain drops by 3 dB can be expressed as $\omega_o \cdot (FG_o+1)$, the product of both, that is, the gain band width product matches the gain band width product of $G_o \cdot \omega_o$ obtained when not feedbacked. In other words, when N=1, even if negative feedbacked, the gain band width product cannot be improved. This implies that when the open loop DC gain and the feedback ratio F are adjusted in such a way that the DC gain can be kept constant, the band can be equalized to that obtained when not feedbacked.

On the other hand, when N≧2, the situation differs from when N=1. When the condition that the closed loop DC gain is kept constant is given, the angular frequency $\omega_c$ at which the gain drops by 3 dB can be improved, as compared with when not feedbacked (F=0). This is because in a high frequency range, since the feedbacked signal is delayed from the input signal 90 degrees or more in phase so that the feedback signal includes the positive feedback components and thereby a peaking effect is obtained. On the other hand, however, as shown in FIG. 6, the gain-frequency characteristics thereof have a peak, so that the flatness of the frequency characteristics deteriorates. In other words, a trade-off (replacement) relationship occurs between $\omega_c$ and $\Delta A_v$, that is, in the difference between the gain peak value and the DC gain. Further, since this trade-off relationship is dependent upon the number N of stages of the unit amplifier circuits and the feedback ratio F, it is important to obtain an optimum point thereof in design process.

Further, in the simplified model of the negative feedback circuit assumed herein, the optimum points have been calculated. FIG. 7 shows the relationship between $\omega_c$ and $\Delta A_v$ obtained by the numerical calculations in accordance with the formula (3) on condition that the closed loop gain in DC is kept constant. In FIG. 7, both the values $\omega_c$ and $\Delta A_v$ obtained when the feedback ratio F is determined as a variable are plotted for each case where N=2, 3, 4 and 5.

FIG. 7 indicates the following facts:

(1) In general, when $\omega_c$ is increased, $\Delta A_v$ is also increased.

(2) Therefore, in order to increase only $\omega_c$ without increasing $\Delta A_v$, N=3 is most effective.

On the basis of the above-mentioned study, it can be understood that a negative feedback amplifier circuit excellent in both the band width and the flatness can be obtained by connecting three-stage unit amplifier circuits and by negative feedbacking the output thereof. In practice, however, when the amplifier circuit constructed as explained above is tried to be constructed, the following problems arise:

In the amplifier circuit assumed herein, since the flat gain characteristics are required from DC to a high frequency, the respective unit amplifier circuits must be connected without use of any coupling capacitances. Therefore, each output level of each unit amplifier circuit must match each operating point of the succeeding-stage unit amplifier circuit. Therefore, as assumed as the above-mentioned simplified model, it is impossible to connect only the common source circuits as a multi-stage connection, so that it is necessary to interpose a level shift circuit such as source follower circuit between the common source circuits.

FIG. 8 shows an example of prior art negative feedback circuit, in which three sets of common source circuits 101, 103 and 105 and source follower circuits 102, 104 and 106 are connected as three-stage connection. In the first stage common source circuit 101, two field effect transistors (referred to as FETs, hereinafter) $T_1$ and $T_2$ are connected in parallel to each other for both an input signal and a feedback signal. In other words, the first stage circuit 101 is provided with two functions of adding and amplifying both the input signal and the feedback signal. When the size ratio of the two FETs is adjusted, the feedback ratio F can be adjusted. Further, in the source follower circuit 102 or 104, three level shifting diodes D1, D2 and D3 or D4, D5 and D6 are connected at three stages to adjust the output level thereof relative to the input level of the succeeding source follower circuit 102 or 104, respectively.

Here, when the prior art negative feedback circuit as shown in FIG. 8 is considered in comparison with the aforementioned simplified model, the number of the connection stages of the source follower circuits must be changed to N=3. In this case, since the gain characteristics of the common source circuit are different from those of the source follower circuit, although the conclusion obtained with respect to the simplified model cannot be applied as it is, it can be considered that in general, the trade-off relationship between the flatness and the band width of the frequency characteristics becomes severe with increasing number of connection stages. In the case of the prior art amplifier circuit shown in FIG. 8, since the number of the stages is six including the source follower circuits, the flatness of the frequency characteristics cannot be expected on the basis of the presumption with respect to the aforementioned simplified model.

By the way, the common source circuit outputs a signal having a polarity opposite to that of the input signal. Therefore, for negative feedback operation, the number of the stages of the common source circuits must be an odd number. As a result, when the number of stages of the circuits shown in FIG. 8 is required to be reduced, the numbers of the common source circuits and the source follower circuits must be both reduced to one stage, respectively. In this case, however, since the numbers of the stages thereof are excessively small, respectively, the band cannot be improved markedly due to the presence of the peaking effect.

As described above, when the band is tried to be widened by applying the negative feedback to the amplifier circuit obtained by connecting a plurality of unit amplifier circuits into a multi-stage, it has been so far impossible to realize the most effective number of stages of the amplifier circuits from the theoretical standpoints.

SUMMARY OF THE INVENTION

With these problems in mind, therefore, it is the object of the present invention to provide a semiconductor amplifier circuit having frequency characteristics excellent in both flatness and band width thereof.

To achieve the above-mentioned object, the present invention provides a semiconductor amplifier circuit, comprising: an input section including: a first inversion amplifier circuit for inversion-amplifying an input signal; and a feedback circuit of a field effect transistor having a grounded gate, a source for receiving a feedback signal, and a drain connected to an output terminal of said first inversion amplifier circuit; a first level shift circuit for shifting level of an output of said input section; a second inversion amplifier circuit for inversion-amplifying an output of said first level shift circuit; and a second level shift circuit for shifting level of an output of said second inversion amplifier circuit, an output of said second level shift circuit being applied to said feedback circuit as the feedback signal.

Here, it is preferable that a first feedback resistance is connected between an output end of said second level shift circuit and the source of the transistor of said feedback circuit.

Further, it is also preferable that a feedback resistance is connected between an output end of said first level shift circuit and an input end of said first inversion amplifier circuit.

Further, it is also preferable that said first inversion amplifier circuit is a common source circuit of a field effect transistor having a gate for receiving the input signal, a drain connected to a supply voltage via a load, and a grounded source.

Further, the present invention provides a semiconductor amplifier circuit, comprising: an input section including: a first inversion amplifier circuit for inversion-amplifying an input signal; and a feedback circuit of a bipolar transistor having a grounded base, an emitter for receiving a feedback signal, and a collector connected to an output terminal of said first inversion amplifier circuit; a first level shift circuit for shifting level of an output of said input section; a second inversion amplifier circuit for inversion-amplifying an output of said first level shift circuit; and a second level shift circuit for shifting level of an output of said second inversion amplifier circuit, an output of said second level shift circuit being applied to said feedback circuit as the feedback signal.

Here, it is preferable that the emitter of the bipolar transistor of said first inversion amplifier circuit is grounded via a parallel circuit having a resistance and a capacitance connected in parallel to each other.

Further, it is also preferable that a first feedback resistance is connected between an output end of said second level shift circuit and the emitter of the transistor of said feedback circuit, the feedback signal being obtained from the output of said second level sift circuit via the feedback resistance.

Further, it is also preferable that a feedback resistance is connected between an output end of said first level shift circuit and an input end of said first inversion amplifier circuit.

BRIEF DESCRIPTION OF THE DRAWINGS

FIG. 1 is a circuit diagram showing a first embodiment of the semiconductor amplifier circuit according to the present invention;

FIG. 5 is a block diagram for assistance in explaining the concept of the negative feedback circuit;

FIG. 6 is a graphical representation showing the gain-frequency characteristics having a peak value;

FIGS. 11A, 11B, 11C and 11D are circuit diagrams each showing a practical level shift element example used for the third embodiment of the amplifier circuit shown in FIG. 9;

FIGS. 12A and 12B are circuit diagrams each showing a practical constant current source example used for the third embodiment of the amplifier circuit shown in FIG. 9;

FIG. 14 is a circuit diagram showing a fifth embodiment of the semiconductor amplifier circuit according to the present invention;

FIG. 16 is a circuit diagram showing a seventh embodiment of the semiconductor amplifier circuit according to the present invention;

FIG. 17 is a circuit diagram showing an eighth embodiment of the semiconductor amplifier circuit according to the present invention;

FIG. 18 is a circuit diagram showing a ninth embodiment of the semiconductor amplifier circuit according to the present invention;

FIG. 19 is a circuit diagram showing a tenth embodiment of the semiconductor amplifier circuit according to the present invention;

DETAILED DESCRIPTION OF THE PREFERRED EMBODIMENTS

Figure 2:
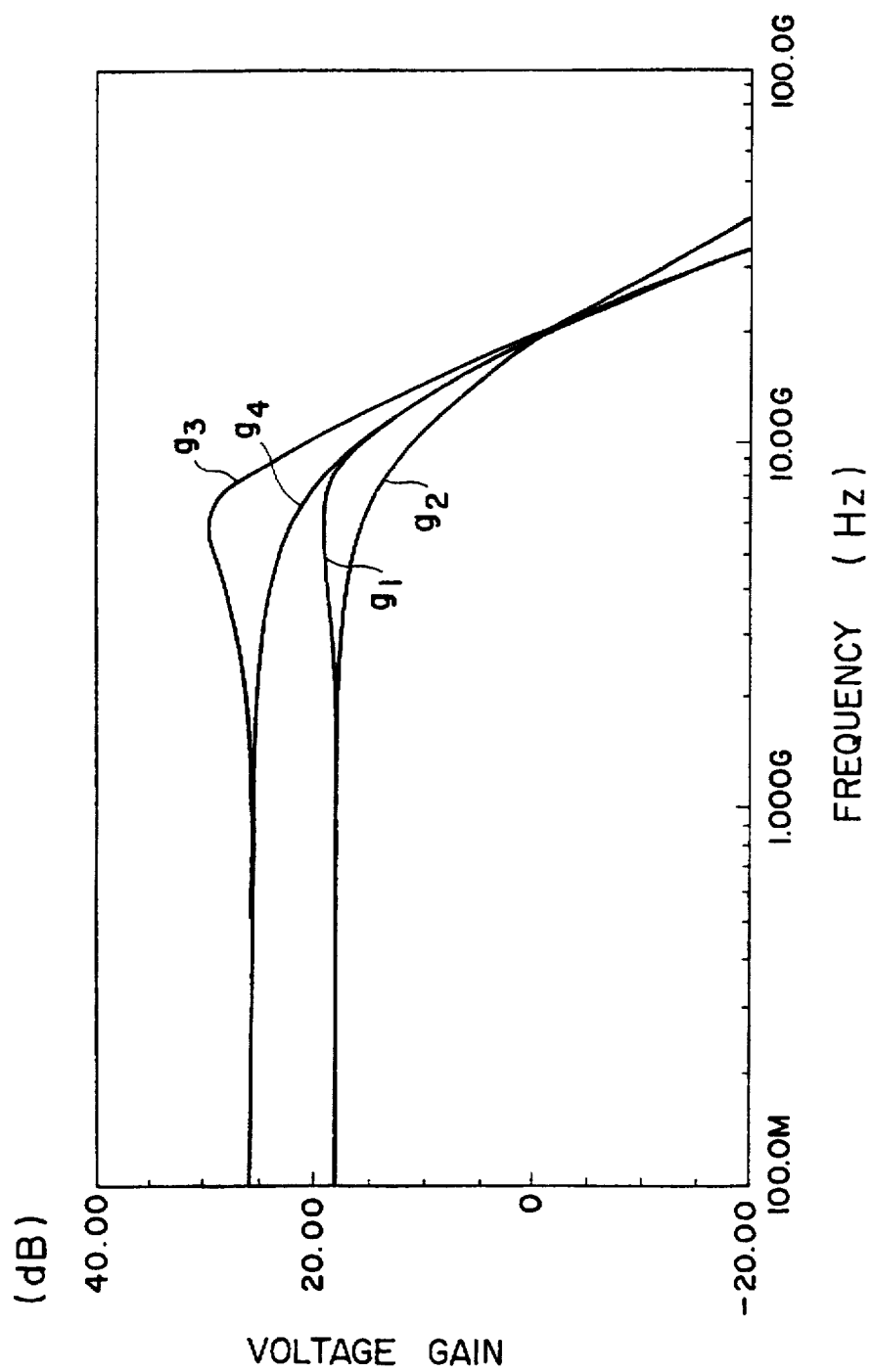
FIG. 2 is a graphical representation for assistance in explaining the effect of the first embodiment of the semiconductor amplifier circuit.

A first embodiment of the semiconductor amplifier circuit (referred to as amplifier circuit, hereinafter) according to the present invention will be described hereinbelow with reference to FIG. 1. The amplifier circuit shown in FIG. 1 is composed of an input circuit 10, a level shift circuit 20, and an inversion amplifier circuit 30, and another level shift circuit 40.

The input circuit 10 is composed of a common source circuit 11 and a common gate circuit 15. The common source circuit 11 is a field effect transistor (e.g., GaAs MESFET) $T_1$ having a gate for receiving an input signal, a drain connected to a high supply voltage $V_{dd}$ via a resistance $R_1$, and a grounded source. Therefore, an inversion signal of the input signal is outputted from the drain of the transistor $T_1$. On the other hand, the common gate circuit 15 is a field effect transistor $T_2$ having a grounded gate, a drain connected to the drain of the transistor $T_1$, and a source connected to a low supply voltage $V_{ss}$ via a resistance $R_2$. A feedback signal is inputted to the source of this transistor $T_2$. In this circuit, since the two transistors $T_1$ and $T_2$ are connected in parallel to each other, the input circuit 10 (11 and 15) has two functions of adding and amplifying both the input signal and the feedback signal.

The level shift circuit 20 is a source follower, which is composed of a field effect transistor $T_3$, three series-connected diodes $D_1$, $D_2$ and $D_3$, and another field effect transistor $T_4$. The transistor $T_3$ has a gate for receiving the output of the input circuit 10, a drain connected to the voltage supply $V_{dd}$, and a source connected to an anode of the diode $D_1$. Further, the transistor $T_4$ has a drain connected to a cathode of the diode $D_3$, and a gate and a source both connected to the supply voltage $V_{ss}$. Therefore, the output of the level shift circuit 20 is transmitted from the drain of the transistor $T_4$ to the inversion amplifier circuit 30.

The inversion amplifier circuit 30 is a common source circuit, which is a field effect transistor $T_5$ having a gate for receiving the output of the level shift circuit 20, a drain connected to the supply voltage $V_{dd}$ via a resistance $R_3$, and a grounded source. Therefore, the output of this inversion amplifier circuit 30 is transmitted from the drain of the transistor $T_5$ to the level shift circuit 40.

The level shift circuit 40 is a source follower, which is composed of a field effect transistor $T_6$, three series-connected diodes $D_4$, $D_5$ and $D_6$, and another field effect transistor $T_7$. The transistor $T_6$ has a gate for receiving the output of the inversion amplifier circuit 30, a drain connected to the supply voltage $V_{dd}$, and a source connected to the anode of the diode $D_4$. Further, the transistor $T_7$ has a drain connected to a cathode of the diode $D_6$, and a gate and a source both connected to the supply voltage $V_{ss}$. Further, the output of the level shift circuit 40 is outputted from the drain of the transistor $T_7$ to the input circuit 10, as the output of the amplifier circuit according to the present invention and as the feedback signal. Further, the transistors $T_1$ to $T_7$ are all of depletion type field effect transistor.

Figure 8:
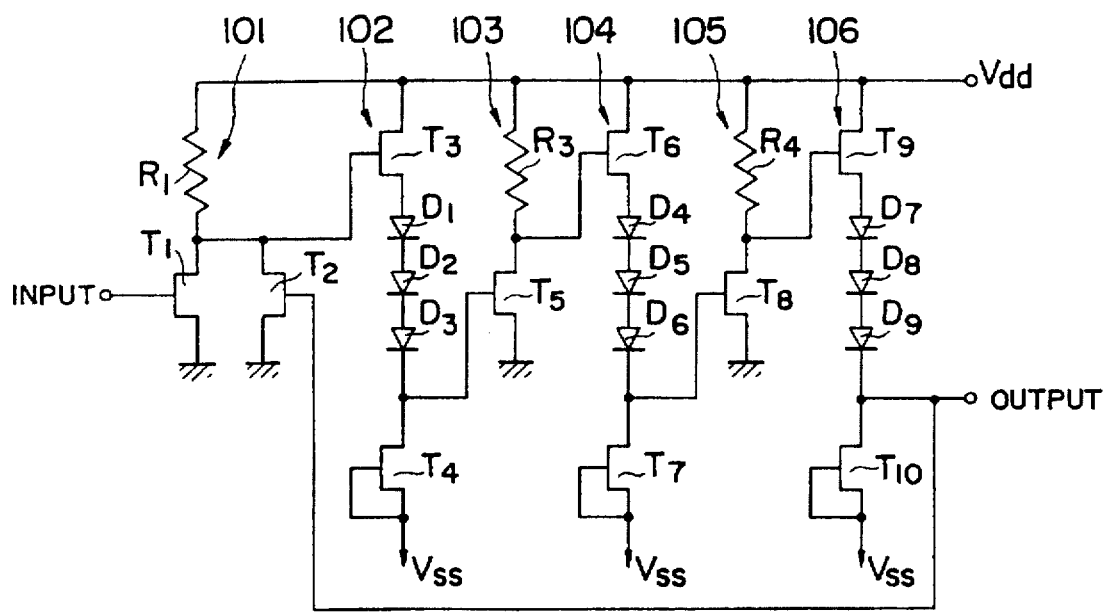
FIG. 8 is a circuit diagram showing the construction of the prior art semiconductor amplifier circuit.

The number of closed-loop stages of the first embodiment constructed as described above is four including the source follower circuits 20 and 40. In contrast with this, the number of stages of the prior art amplifier circuit shown in FIG. 8 is six. Therefore, in both the cases (this embodiment and the prior art), it may be possible to expect that the band width can be improved, as compared with when not feedbacked. In this case, however, since the number of the stages of this first embodiment is smaller than that of the prior art, it is possible to expected that the frequency characteristics of this embodiment is superior in flatness.

FIG. 2 is the simulation results of the amplifier circuit shown in FIG. 1, in which g1 denotes the frequency characteristics of the voltage gain of the first embodiment of the amplifier circuit; and g2 denotes the frequency characteristics of the voltage gain of an amplifier circuit in which the feedback circuit (the common gate circuit 15) is removed from the circuit shown in FIG. 1 and further the resistances $R_1$ and $R_3$ of the common source circuits 11 and 30 are so adjusted that the DC gain thereof matches that of the amplifier circuit shown in FIG. 1. Further, g3 denotes the frequency characteristics of the voltage gain of the prior art amplifier circuit shown in FIG. 8; and g4 denotes the frequency characteristics of the voltage gain of another amplifier circuit in which the feedback circuit is removed from that shown in FIG. 8 and further the resistances $R_1$, $R_3$ and $R_4$ of the common source circuits 101, 103 and 105 are so adjusted that the DC gain matches that of the prior art amplifier circuit shown in FIG. 8.

The simulation results shown in FIG. 2 indicate that the index $\Delta A_v$ (the difference between the gain peak value and the DC gain) indicative of the flatness of the frequency characteristics is 4 dB in the case of the prior art amplifier circuit, but 1 dB in the case of the first embodiment of the amplifier circuit according to the present invention, so that it is possible to confirm that the flatness of the frequency characteristics of this embodiment is superior to that of the prior art amplifier circuit. Further, in both the embodiment circuit and the prior art circuit, although the band width can be improved by about 60%, as compared with when not feedbacked, FIG. 2 indicates that the band width of this embodiment circuit is wider than that of the prior art circuit.

As described above, in the first embodiment of the amplifier circuit according to the present invention, it is possible to obtain the frequency characteristics excellent in both band width and flatness.

Figure 3:
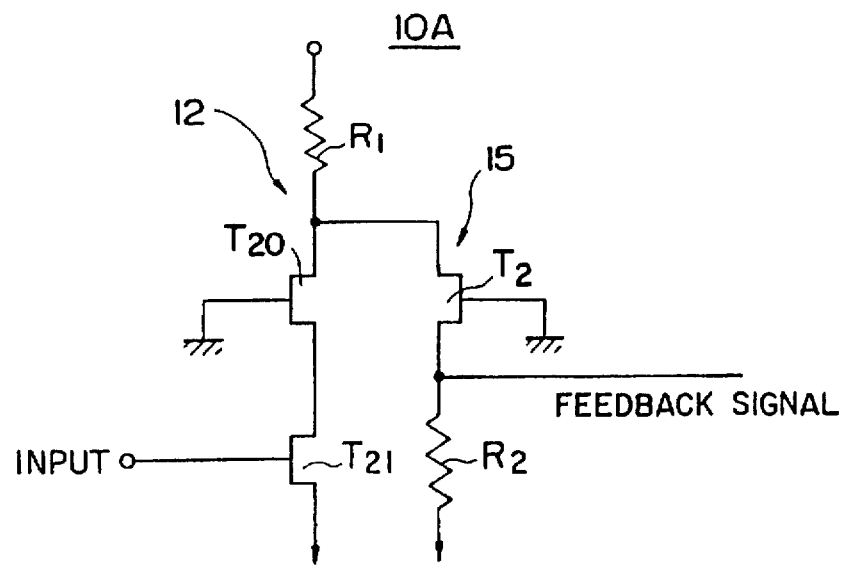
FIG. 3 is a circuit diagram showing another practical example of the input circuit of the first embodiment.

Further, in the first embodiment of the amplifier circuit according to the present invention, although the common source circuit 11 of the input circuit 10 is provided with the function for inversion-amplifying the input signal, any circuit can be used instead thereof, as far as the circuit can inversion-amplify the input signal. For instance, an inversion amplifier circuit 12 in which two field effect transistors $T_{20}$ and $T_{21}$ are cascode-connected as shown in FIG. 3 can be used instead of the common source circuit 11 shown in FIG. 1.

Figure 4:
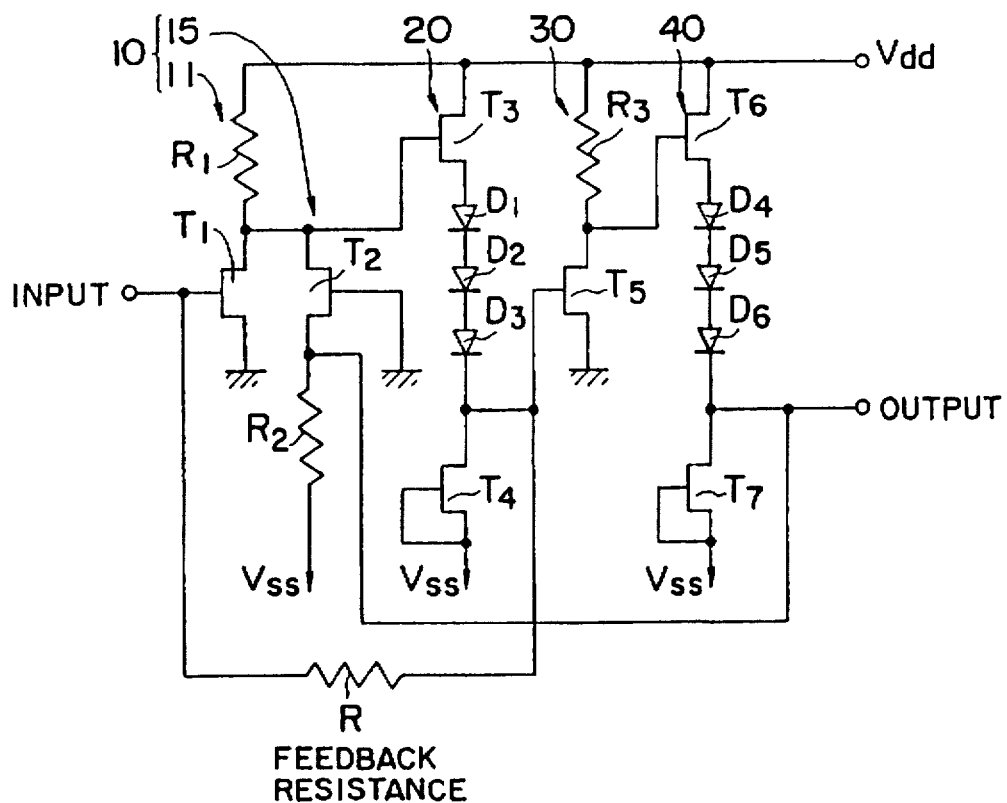
FIG. 4 is a circuit diagram showing a second embodiment of the semiconductor amplifier circuit according to the present invention.
Figure 7:
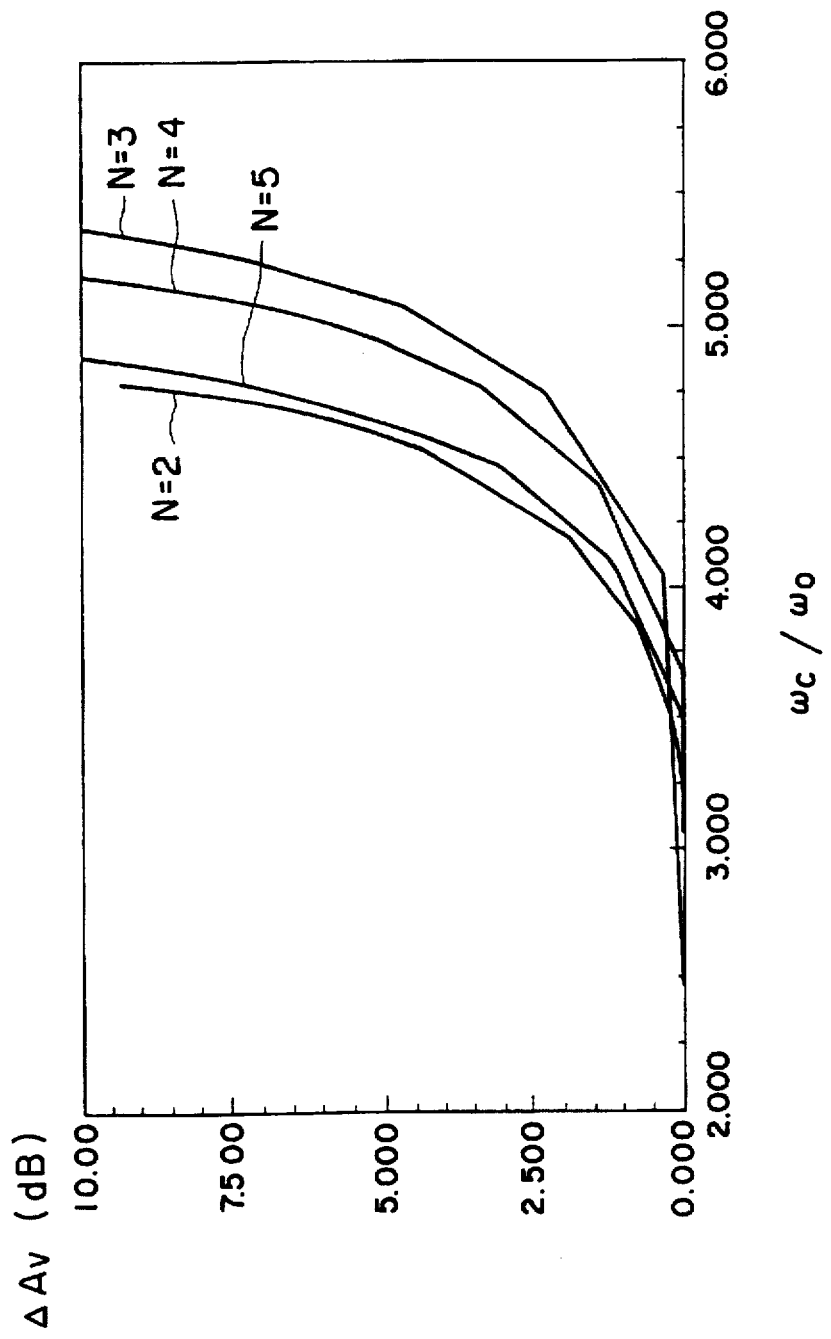
FIG. 7 is a graphical representation showing the band $\omega_c$ and the frequency characteristic flatness $\Delta A_v$ of a simplified negative feedback circuit.

A second embodiment of the semiconductor amplifier circuit according to the present invention will be described hereinbelow with reference to FIG. 4. The second embodiment shown in FIG. 4 is different from the first embodiment shown in FIG. 1 in that an output of the level shift circuit 20 is additionally feedbacked to the gate of the common source circuit 11 through a feedback resistance R, as double feedback amplifier. This second embodiment is known as a trans-impedance type negative feedback amplifier, in which an output signal opposite in phase to the input signal is returned to the input via a feedback resistance. That is, in this second embodiment, the gist of the present invention is applied to a trans-impedance type amplifier. In this embodiment, it is possible to obtain the excellent frequency characteristics in the same way as with the case of the first embodiment.

Figure 9:
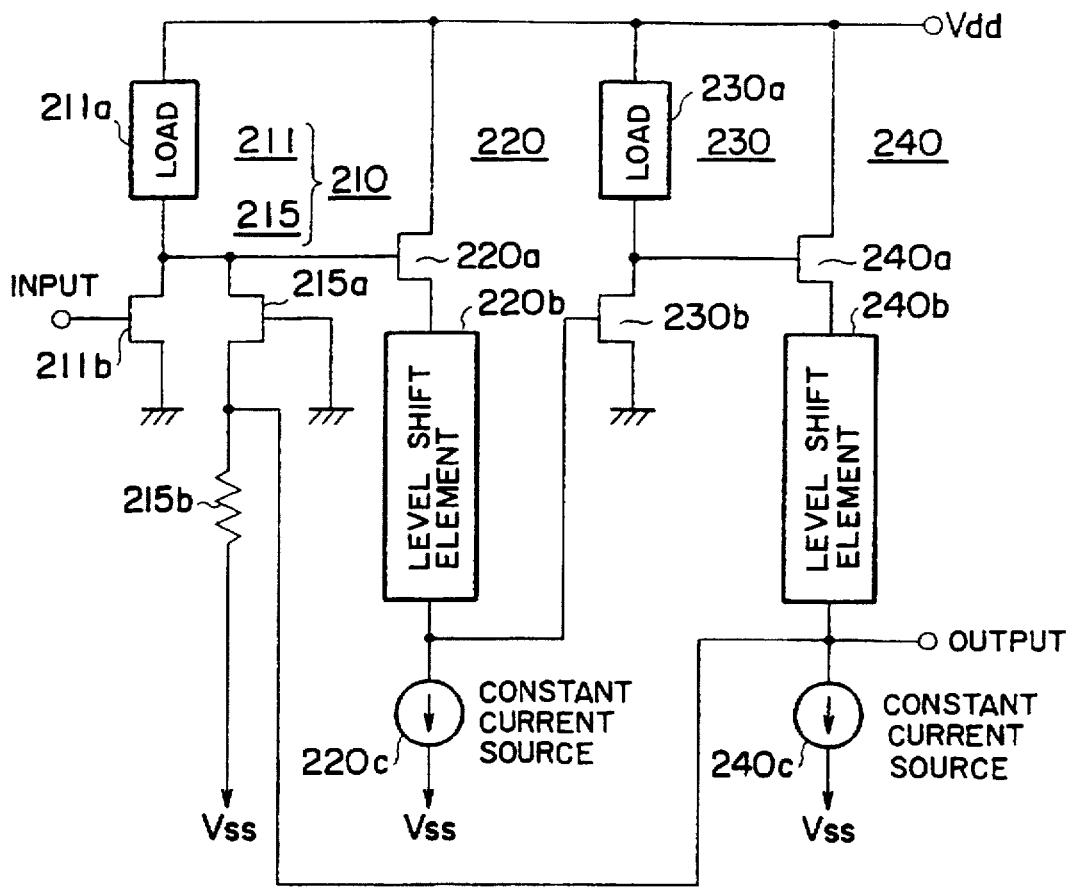
FIG. 9 is a circuit diagram showing a third embodiment of the semiconductor amplifier circuit according to the present invention.

A third embodiment of the semiconductor amplifier circuit according to the present invention will be described hereinbelow with reference to FIG. 9. The third embodiment shown in FIG. 9 is composed of an input circuit 210, a level shift circuit 220, an inversion amplifier circuit 230, and another level shift circuit 240.

The input circuit 210 is composed of a common source circuit 211 and a common gate circuit 215. The common source circuit 211 is a depletion type field effect transistor (e.g., GaAs MESFET) 211b having a gate for receiving an input signal, a drain connected to a high supply voltage $V_{dd}$ via a load 211a, and a grounded source. Therefore, an inversion signal of the input signal is outputted from the drain of the transistor 211b. On the other hand, the common gate circuit 215 is a depletion type field effect transistor 215a having a grounded gate, a drain connected to the drain of the transistor 211b, and a source connected to a low supply voltage $V_{ss}$ via a resistance 215b. A feedback signal is inputted to the source of this transistor 215a. Therefore, since the two transistors 211b and 215a are connected in parallel to each other, the input circuit 210 (211b and 215a) has two functions of adding and amplifying both the input signal and the feedback signal.

The level shift circuit 220 is a source follower, which is composed of a depletion type field effect transistor 220a, a level shift element 220b, and a constant current source 220c. The transistor 220a has a gate for receiving the output of the input circuit 210, a drain connected to the voltage supply $V_{dd}$, and a source connected to one end of the level shift element 220b. Further, one end of the constant current source 220c is connected to the other end of the level shift element 220b, and the other end thereof is connected to the supply voltage $V_{ss}$. Therefore, the output of the level shift circuit 220 is transmitted from the other end of the level shift element 220b to the inversion amplifier circuit 230.

The inversion amplifier circuit 230 is a common source circuit, which has a depletion type field effect transistor 230b having a gate for receiving the output of the level shift circuit 220, a drain connected to the supply voltage $V_{dd}$ via a load 230, and a grounded source. Therefore, the output of this inversion amplifier circuit 230 is transmitted from the drain of the transistor 230b to the level shift circuit 240.

The level shift circuit 240 is a source follower, which is composed of a depletion type field effect transistor 240a, a level shift element 240b, and a constant current source 240c. The transistor 240a has a gate for receiving the output of the inversion amplifier circuit 230, a drain connected to the supply voltage $V_{dd}$, and a source connected to one end of the level shift element 240b. Further, one end of the constant current source 240c is connected to the other end of the level shift element 240b, and the other end thereof is connected to the supply voltage $V_{ss}$. Further, the output of the level shift circuit 240 is outputted from the other end of the level shift element 240b, as the output of the amplifier circuit of this embodiment and as the feedback signal to the input circuit 210.

In the third embodiment of the amplifier circuit, since the number of closed-loop stages is four including the source follower circuits, it is possible to obtain the frequency characteristics excellent in both band width and flatness, as with the case of the first embodiment.

Figure 10A:
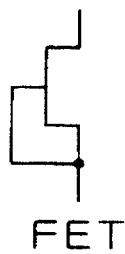
FIGS. 10A, 10B and 10C are circuit diagrams each showing a practical load example used for the third embodiment of the amplifier circuit shown in FIG. 9.
Figure 10B:
Figure 10C:

Further, in this third embodiment of the amplifier circuit, as the loads 211a and 230a, it is possible to use a field effect transistor whose gate and source are connected to each other as shown in FIG. 10A, or a resistance as shown in FIG. 10B, or a diode as shown in FIG. 10C. Further, as the level shift elements 220b and 240b, it is possible to use a plurality of series-connected diodes as shown in FIG. 11A, or a plurality of series-connected FETs as shown in FIG. 11B. Further, in the above-mentioned level shift element, when a bypass capacitance is connected in parallel to the series-connected diodes or FETs as shown in FIG. 11C or FIG. 11D, it is possible to improve the frequency characteristics of the amplifier circuit.

Further, as the constant current sources 220c and 240c, it is possible to use an FET whose gate and source are connected to each other so as to operate in a saturation region as shown in FIG. 12A, or a series-connected FET (to which an external bias potential is applied) and a resistance as shown in FIG. 12B. Further, the resistance shown in FIG. 12B servers to suppress the dispersion of current values when the threshold voltage of the FET disperses. However, this resistance can be eliminated according to circumstances.

Further, in the third embodiment, although the depletion type FETs are used for the FETs 211b, 215a, 220a, 220c, 230b, 240a and 240c, respectively, the enhancement type FETs can be used therefore.

Figure 13:
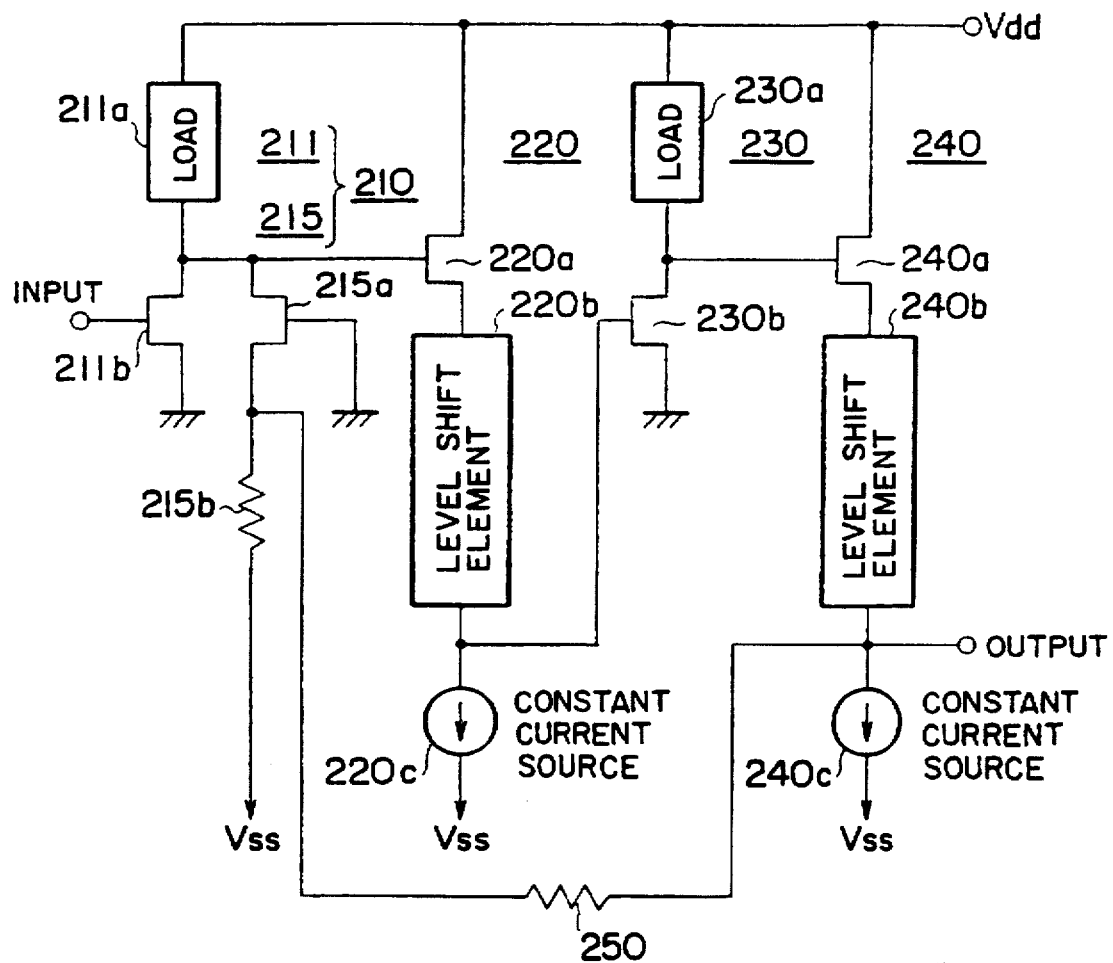
FIG. 13 is a circuit diagram showing a fourth embodiment of the semiconductor amplifier circuit according to the present invention.

A fourth embodiment of the amplifier circuit according to the present invention will be described hereinbelow with reference to FIG. 13. The fourth embodiment shown in FIG. 13 is different from the third embodiment shown in FIG. 9 in that an output of the level shift circuit 240 is feedbacked to the source of the common gate circuit 215 (FET 215a) through an additional feedback resistance 250, as double feedback amplifier.

In the amplifier circuit of this type, the feedback ratio of the negative feedback circuit can be adjusted by not only the gate width of the common gate circuit 215 (FET 215a) but also the feedback resistance 250. Further, when the feedback resistance 250 is adjustably constructed by a transfer gate formed of an FET, it is possible to change the amplification factor of the amplifier circuit of this second embodiment. In this fourth embodiment, it is of course possible to obtain the same effect as with the case of the third embodiment.

A fifth embodiment of the semiconductor amplifier circuit according to the present invention will be described hereinbelow with reference to FIG. 14. The fifth embodiment shown in FIG. 14 is different from the third embodiment shown in FIG. 9 in that an output of the level shift circuit 220 is additionally feedbacked to the gate of the common source circuit 211 (FET 211b) through a feedback resistance 260, as trans-impedance amplifier.

Further, in this fifth embodiment, it is of course possible to obtain the same effect as with the case of the third embodiment.

Figure 15:
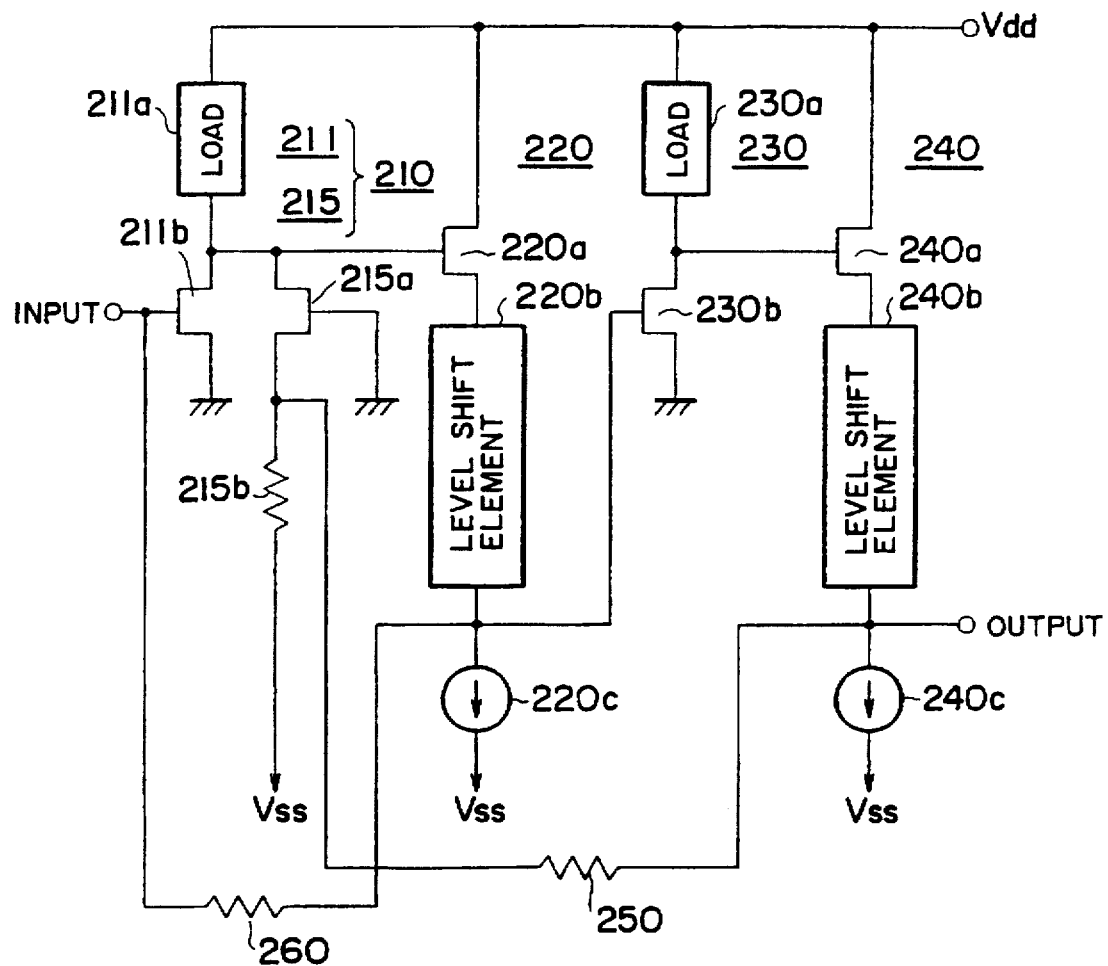
FIG. 15 is a circuit diagram showing a sixth embodiment of the semiconductor amplifier circuit according to the present invention.

A sixth embodiment of the semiconductor amplifier circuit according to the present invention will be described hereinbelow with reference to FIG. 15. The sixth embodiment shown in FIG. 15 is different from the fourth embodiment shown in FIG. 13 in that an output of the level shift circuit 220 is additionally feedbacked to the gate of the common source circuit 211 (FET 211b) through a feedback resistance 260.

Further, in this sixth embodiment, it is of course possible to obtain the same effect as with the case of the fourth embodiment.

A seventh embodiment of the semiconductor amplifier circuit according to the present invention will be described hereinbelow with reference to FIG. 16. The seventh embodiment shown in FIG. 16 is composed of an input circuit 310, a level shift circuit 320, an inversion amplifier circuit 330, and another level shift circuit 340.

The input circuit 310 is composed of a common emitter circuit 311 and a common base circuit 315. The common emitter circuit 311 is a bipolar transistor 311b having a base for receiving an input signal, a collector connected to a high supply voltage $V_{dd}$ via a load 311a, and a grounded emitter. Therefore, an inversion signal of the input signal is outputted from the collector of the transistor 311b. On the other hand, the common base circuit 315 is a bipolar transistor 315a having a grounded base, a collector connected to the collector of the transistor 311b, and an emitter connected to a low supply voltage $V_{ss}$ via a resistance 315b.. A feedback signal is inputted to the emitter of this transistor 315a. Therefore, since the two transistors 311b and 315a are connected in parallel to each other, the input circuit 310 (311b and 315a) has two functions of adding and amplifying both the input signal and the feedback signal.

The level shift circuit 320 is a source follower, which is composed of a bipolar transistor 320a, a level shift element 320b, and a constant current source 320c. The transistor 320a has a base for receiving the output of the input circuit 310, a collector connected to the voltage supply $V_{dd}$, and an emitter connected to one end of the level shift element 320b. Further, one end of the constant current source 320c is connected to the other end of the level shift element 320b, and the other end thereof is connected to the supply voltage $V_{ss}$. Therefore, the output of the level shift circuit 320 is transmitted from the other end of the level shift element 320b to the inversion amplifier circuit 330.

The inversion amplifier circuit 330 is a common emitter circuit, which is a bipolar transistor 330b having a base for receiving the output of the level shift circuit 320, a collector connected to the supply voltage $V_{dd}$ via a load 330, and an emitter connected to the supply voltage $V_{ss}$ via a resistance 330c. Therefore, the output of this inversion amplifier circuit 330 is transmitted from the collector of the transistor 330b to the level shift circuit 340.

The level shift circuit 340 is a source follower, which is composed of a bipolar transistor 340a, a level shift element 340b, and a constant current source 340c. The transistor 340a has a base for receiving the output of the inversion amplifier circuit 330, a collector connected to the supply voltage $V_{dd}$, and an emitter connected to one end of the level shift element 340b. Further, one end of the constant current source 340c is connected to the other end of the level shift element 340b, and the other end thereof is connected to the supply voltage $V_{ss}$. Further, the output of the level shift circuit 340 is outputted from the other end of the level shift element 340b, as the output of the amplifier circuit of this embodiment and as the feedback signal to the input circuit 310.

In the seventh embodiment of the amplifier circuit, the resistances 311c and 330c are connected to the emitters of the common emitter circuits 311 and 330, respectively to improve the stability of the bias points of these circuits 311 and 330. Further, two bypass capacitances 311d and 330d each having a sufficient capacity are connected to these resistances 311c and 330c, respectively, to ground the two emitter nodes of the two bipolar transistors 311b and 330b from AC standpoint. In the seventh embodiment, since the number of closed-loop stages is four including the emitter follower circuits, it is possible to obtain the frequency characteristics excellent in both band width and flatness, in the same way as with the case of the other embodiments.

An eighth embodiment of the semiconductor amplifier circuit according to the present invention will be described hereinbelow with reference to FIG. 17. The eighth embodiment shown in FIG. 17 is different from the seventh embodiment shown in FIG. 16 in that an output of the level shift circuit 320 is additionally feedbacked to the base of the transistor 311b of the common emitter circuit 311 through a feedback resistance 350, as a trans-impedance type amplifier.

In this eighth embodiment, it is of course possible to obtain the same effect as with the case of the seventh embodiment.

A ninth embodiment of the semiconductor amplifier circuit according to the present invention will be described hereinbelow with reference to FIG. 18. The ninth embodiment shown in FIG. 18 is different from the seventh embodiment shown in FIG. 16 in that an output of the level shift circuit 340 is feedbacked to the emitter of the transistor 315a of the common base circuit 315 through an additional feedback resistance 360. Therefore, it is possible to adjust the feedback ratio of the negative feedback circuit by not only the base width of the transistor 315a but also the feedback resistance 360.

In this ninth embodiment, it is of course possible to obtain the same effect as with the case of the seventh embodiment.

A tenth embodiment of the semiconductor amplifier circuit according to the present invention will be described hereinbelow with reference to FIG. 19. The tenth embodiment shown in FIG. 19 is different from the eighth embodiment shown in FIG. 17 in that an output of the level shift circuit 340 is feedbacked to the emitter of the transistor 315a of the common base circuit 315 through an additional feedback resistance 360.

In this tenth embodiment, it is of course possible to obtain the same effect as with the case of the eighth embodiment.

Figure 20A:
FIGS. 20A, 20B, 20C and 20D are circuit diagrams each showing a practical level shift element used for the seventh to tenth embodiments of the amplifier circuit.
Figure 20B:
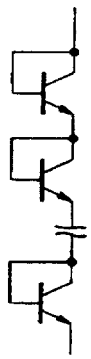
Figure 20C:
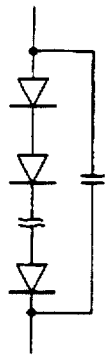
Figure 20D:
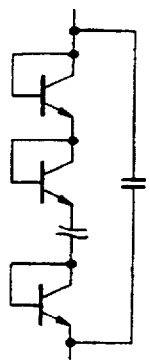

Further, in the seventh to tenth embodiments of the amplifier circuit, as the level shift elements 320b and 340b, it is possible to use a plurality of series-connected diodes as shown in FIG. 20A or a plurality of series-connected bipolar transistors as shown in FIG. 20B. Further, in the above-mentioned level shift element, when a bypass capacitance is connected in parallel to the series-connected diodes or bipolar transistors as shown in FIG. 20C or FIG. 20D, it is possible to improve the frequency characteristics of the seventh to tenth embodiments of the amplifier circuit.

Figure 21A:
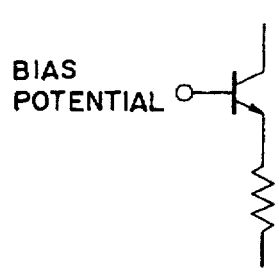
FIGS. 21A and 21B are circuit diagrams each showing a practical constant current source example used for the seventh to tenth embodiments of the amplifier circuit.
Figure 21B:

Further, in the seventh and tenth embodiments, as the constant current sources 320c and 340c, it is possible to use a series-connected bipolar transistor (to the base of which an external bias potential is applied) and a resistance as shown in FIG. 21A. Further, the constant current sources 320c and 340c used for the emitter follower circuits 320 and 340 can be constructed by use of only a resistance, respectively. This is because since the transconductance of the bipolar transistor is larger than that of the FET, the gain of the emitter follower hardly decreases.

As described above, in the semiconductor amplifier circuit according to the present invention, it is possible to obtain the frequency characteristics excellent in both the band width and flatness.

What is claimed is:

1. A semiconductor amplifier circuit, comprising:
   an input section including:
      a first inversion amplifier circuit for inversion-amplifying an input signal; and
      a feedback circuit of a field effect transistor having a grounded gate, a source for receiving a feedback signal, and a drain connected to an output terminal of said first inversion amplifier circuit;
   a first level shift circuit for shifting level of an output of said input section;
   a second inversion amplifier circuit for inversion-amplifying an output of said first level shift circuit; and
   a second level shift circuit for shifting level of an output of said second inversion amplifier circuit, an output of said second level shift circuit being applied to said feedback circuit as the feedback signal.

2. The semiconductor amplifier circuit of claim 1, wherein a first feedback resistance is connected between an output end of said second level shift circuit and the source of the transistor of said feedback circuit, the feedback signal being obtained from the output of said second level sift circuit via the feedback resistance.

3. The semiconductor amplifier circuit of claim 1, wherein a feedback resistance is connected between an output end of said first level shift circuit and an input end of said first inversion amplifier circuit.

4. The semiconductor amplifier circuit of claim 2, wherein a second feedback resistance is connected between an output end of said first level shift circuit and an input end of said first inversion amplifier circuit.

5. The semiconductor amplifier circuit of claim 1, wherein said first inversion amplifier circuit is a source circuit of a field effect transistor having a gate for receiving the input signal, a drain connected to a supply voltage via a load, and a grounded source.

6. The semiconductor amplifier circuit of claim 5, wherein a first feedback resistance is connected between an output end of said second level shift circuit and the source of the transistor of said feedback circuit, the feedback signal being obtained from the output of said second level shift circuit via the feedback resistance.

7. The semiconductor amplifier circuit of claim 5, wherein a feedback resistance is connected between an output end of said first level shift circuit and an input end of said first inversion amplifier circuit.

8. The semiconductor amplifier circuit of claim 6, wherein a second feedback resistance is connected between an output end of said first level shift circuit and an input end of said first inversion amplifier circuit.

9. A semiconductor amplifier circuit, comprising:
   an input section including:
      a first inversion amplifier circuit for inversion-amplifying an input signal; and
      a feedback circuit of a bipolar transistor having a grounded base, an emitter for receiving a feedback signal, and a collector connected to an output terminal of said first inversion amplifier circuit;
   a first level shift circuit for shifting level of an output of said input section;
   a second inversion amplifier circuit for inversion-amplifying an output of said first level shift circuit; and
   a second level shift circuit for shifting level of an output of said second inversion amplifier circuit, an output of said second level shift circuit being applied to said feedback circuit as the feedback signal.

10. The semiconductor amplifier circuit of claim 9, wherein a first feedback resistance is connected between an output end of said second level shift circuit and the emitter of the transistor of said feedback circuit, the feedback signal being obtained from the output of said second level sift circuit via the feedback resistance.

11. The semiconductor amplifier circuit of claim 9, wherein a feedback resistance is connected between an output end of said first level shift circuit and an input end of said first inversion amplifier circuit.

12. The semiconductor amplifier circuit of claim 10, wherein a second feedback resistance is connected between an output end of said first level shift circuit and an input end of said first inversion amplifier circuit.

13. The semiconductor amplifier circuit of claim 9, wherein said first inversion amplifier circuit is a emitter circuit of a bipolar transistor having a base for receiving the input signal, a collector connected to a supply voltage via a load, and a grounded emitter.

14. The semiconductor amplifier circuit of claim 13, wherein a first feedback resistance is connected between an output end of said second level shift circuit and the emitter of the transistor of said feedback circuit, the feedback signal being obtained from the output of said second level sift circuit via the feedback resistance.

15. The semiconductor amplifier circuit of claim 13, wherein a feedback resistance is connected between an output end of said first level shift circuit and an input end of said first inversion amplifier circuit.

16. The semiconductor amplifier circuit of claim 14, wherein a second feedback resistance is connected between an output end of said first level shift circuit and an input end of said first inversion amplifier circuit.

17. The semiconductor amplifier circuit of claim 13, wherein the emitter of the bipolar transistor of said first inversion amplifier circuit is grounded via a parallel circuit having a resistance and a capacitance connected in parallel to each other.

18. The semiconductor amplifier circuit of claim 17, wherein a first feedback resistance is connected between an output end of said second level shift circuit and the emitter of the transistor of said feedback circuit, the feedback signal being obtained from the output of said second level sift circuit via the feedback resistance.

19. The semiconductor amplifier circuit of claim 17, wherein a feedback resistance is connected between an output end of said first level shift circuit and an input end of said first inversion amplifier circuit.

20. The semiconductor amplifier circuit of claim 18, wherein a second feedback resistance is connected between an output end of said first level shift circuit and an input end of said first inversion amplifier circuit.

* * * * *